United States Patent
Crowley

(10) Patent No.: US 6,905,579 B2
(45) Date of Patent: Jun. 14, 2005

(54) CYLINDRICAL MAGNETRON TARGET AND SPINDLE APPARATUS

(75) Inventor: Daniel T. Crowley, Owatonna, MN (US)

(73) Assignee: Sputtering Components, Inc., Livermore, CA (US)

( * ) Notice: Subject to any disclaimer, the term of this patent is extended or adjusted under 35 U.S.C. 154(b) by 0 days.

(21) Appl. No.: 10/365,232

(22) Filed: Feb. 13, 2003

(65) Prior Publication Data

US 2004/0159539 A1 Aug. 19, 2004

(51) Int. Cl.[7] ............................................. C23C 14/35
(52) U.S. Cl. ......................... 204/192.12; 204/298.28; 204/298.22
(58) Field of Search ...................... 204/192.12, 298.22, 204/298.28

(56) References Cited

U.S. PATENT DOCUMENTS

| | | | |
|---|---|---|---|
| 5,096,562 A | 3/1992 | Boozenny et al. | 204/298.22 |
| 5,571,393 A * | 11/1996 | Taylor et al. | 204/298.21 |
| 5,591,314 A | 1/1997 | Morgan et al. | 204/298.22 |
| 5,855,744 A | 1/1999 | Halsey et al. | 204/192.12 |
| 6,645,358 B2 * | 11/2003 | Lupton et al. | 204/298.13 |

* cited by examiner

Primary Examiner—Steven VerSteeg
(74) Attorney, Agent, or Firm—Moore, Hansen & Sumner, PLLP

(57) ABSTRACT

A cylindrical magnetron target and spindle attachment apparatus for affixing a cylindrical magnetron target to a rotatable support spindle. The attachment apparatus includes a target and a spindle. The target defines a receiving portion. The spindle has a spindle plug. The spindle plug is disposed within the receiving portion of the target. The attachment apparatus increases the speed and ease of removing and installing cylindrical rotating targets onto a support spindle.

16 Claims, 2 Drawing Sheets

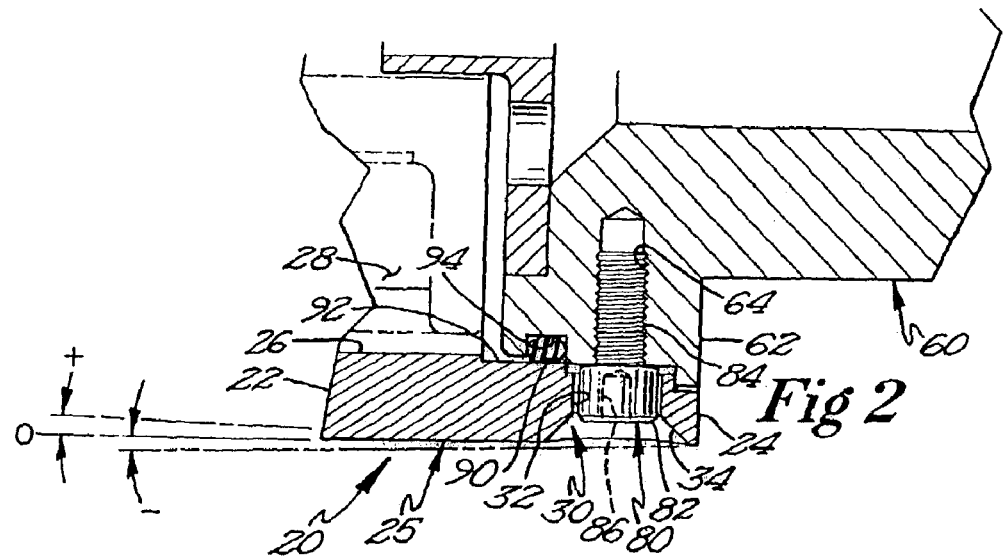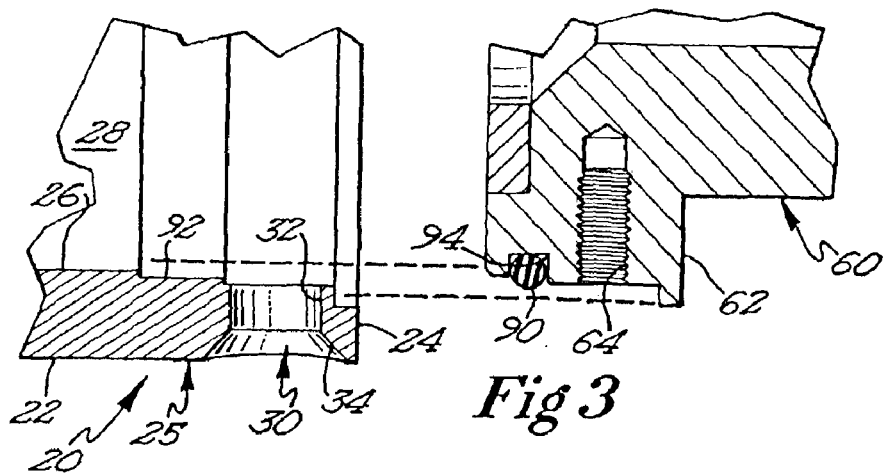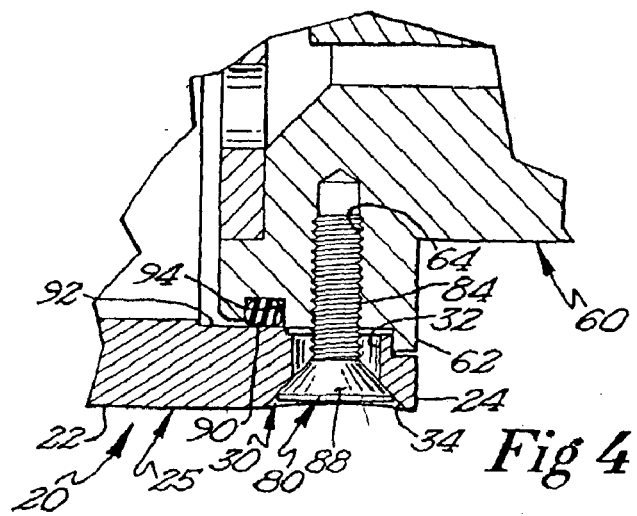

CYLINDRICAL MAGNETRON TARGET AND SPINDLE APPARATUS

BACKGROUND OF THE INVENTION

The present invention relates generally to ion sputtering cylindrical magnetrons utilized for coating substrate articles and, more specifically, to attachment apparatuses for affixing a cylindrical magnetron target to a target mounting spindle.

A major method for depositing a thin coating on large-surface-area substrates, such as computer monitor screens, architectural glass panels, automobile windshields, and the like is ion sputtering. The coating materials are deposited with a magnetron in a vacuum chamber upon the substrate utilizing reactive and/or inert gases and have been known in the art for some time. For example, a cylindrical target structure in a magnetron is described in Boozenny, et al., U.S. Pat. No. 5,096,562. The target structure employs a removable support spindle at each end of the cylindrical target structure. The support spindle at one end supplies and withdraws cooling fluid from within the cylinder that contains a driving mechanism for rotation. A second support spindle at the other end of the target structure contains an electrical power connection to the target surface. A more recent example of an attachment apparatus that affixes a rotatable cylindrical magnetron target to a support spindle is disclosed in Morgan, U.S. Pat. No. 5,591,314. The apparatus is used to releasably affix a rotating cylindrical magnetron target to a spindle utilizing a threaded spindle collar. The spindle collar engages threads on the outside surface of the target with a single water-to-vacuum seal located at the target and spindle interface. The threads may be removed from the target for repair and replacement.

However, there are some drawbacks to the currently known attachment devices affixing a rotatable cylindrical magnetron target to a support spindle. It is difficult to unscrew existing collar designs because the parts have become exposed to the sputtering process, the intense heating, and the coating build-up over the parts. Other problems arise when attempting to unscrew target collars by hammering with a spanner wrench to disengage the target. Additional problems are created by spindle run-out when there is imperfect parallelism between the target face and the spindle it is attached to. Cylindrical magnetron target repair and replacement can be a costly, time-consuming process in its large manufacturing plant environment.

Currently known attachment devices involve a costly, time-consuming repair process when removing the spindle from the target for significant reasons. It can be very difficult to access and to adjust the four loosening screws that are used to produce proper O-ring compression in the restricted space on the back of the spindle between the target and the end block from which the spindle protrudes. Secondly, problems are caused when unscrewing the collar from the end of the target by inserting a spanner nut wrench into the gap on the back of the spindle and into some holes in the collar. The spanner nut wrench is generally hit repeatedly with a hammer to get the collar to come loose and off. This hammering action can damage drive parts inside the end block and other drive-train components of the ion sputtering magnetron.

Thus, there is a need for new attachment apparatus between cylindrical target and spindles which eliminates those disadvantages.

BRIEF SUMMARY OF THE INVENTION

The present invention includes an apparatus for attaching a rotatable cylindrical magnetron target to a rotatable support spindle. Several design improvements have been incorporated into the attachment apparatus for improving the magnetron target-to-support spindle connection. The objectives in creating the improved attachment apparatus includes increasing the speed and ease of removing and installing cylindrical rotating targets onto a support spindle, and simplifying the attachment apparatus and its manufacture by reducing the number of required parts while maintaining the advantages of a single water-to-vacuum seal. The invention also provides the option of a flexible or a fixed connection between the target and the spindle. The advantage of a flexible coupling is to allow movement in order to eliminate forces otherwise transferred through the spindle to the bearings and seals. Easy access to the fasteners is provided for fast removal. The problematic target collar is eliminated. Spindle run-out is no longer significantly affected by imperfect parallelism of the target face relative to the spindle attachment. This invention allows rotation in either direction. The present invention is less time-consuming and less expensive to repair. A target can be removed from the spindle up to five times faster than current methods.

An apparatus is provided for fixing a cylindrical magnetron target to a rotatable support spindle. The apparatus comprises a cylindrical target structure defining a receiving portion. The apparatus also includes a support spindle structure having an extending portion at one end thereof. The extending portion is exposed within the receiving portion of the cylindrical target structure. The support spindle structure is connected to the cylindrical target structure.

The target structure defines a head aperture for receiving a head portion of a fastener and the extending portion of the support spindle structure defines a thread aperture for receiving a thread portion of a fastener. The head aperture has a portion for receiving the head portion of a socket fastener. The head aperture also has a portion for receiving the head portion of a flat fastener. The head aperture has a portion for receiving the head portion of both a socket fastener and a flat fastener. A high-powered ion sputtering magnetron comprises an apparatus for affixing a cylindrical magnetron target to a rotatable support spindle. That apparatus comprises a cylindrical target structure including a receiving portion. The apparatus also comprises a support spindle structure having an extending portion at one end. The extending portion is disposed within the receiving portion of the cylindrical target structure. The support spindle structure is connected to the cylindrical target structure.

A method for affixing a cylindrical magnetron target to a rotatable support spindle is provided. The method comprises providing a cylindrical target structure including a receiving portion and providing a support spindle structure having an extending portion at one end thereof, the extending portion being disposed within the receiving portion of the cylindrical target structure and the support spindle structure being connected to the cylindrical target structure. In that method, the target tube includes a head aperture for receiving.

BRIEF DESCRIPTION OF THE DRAWINGS

Other objects, common features and advantages of the present inventions will become more fully apparent from the following detailed description of preferred embodiment, the appended claims and the accompanying drawings in which:

FIG. 2 is an enlarged cross-sectional view of the improved magnetron target and spindle attachment apparatus of FIG.

Figure 1:
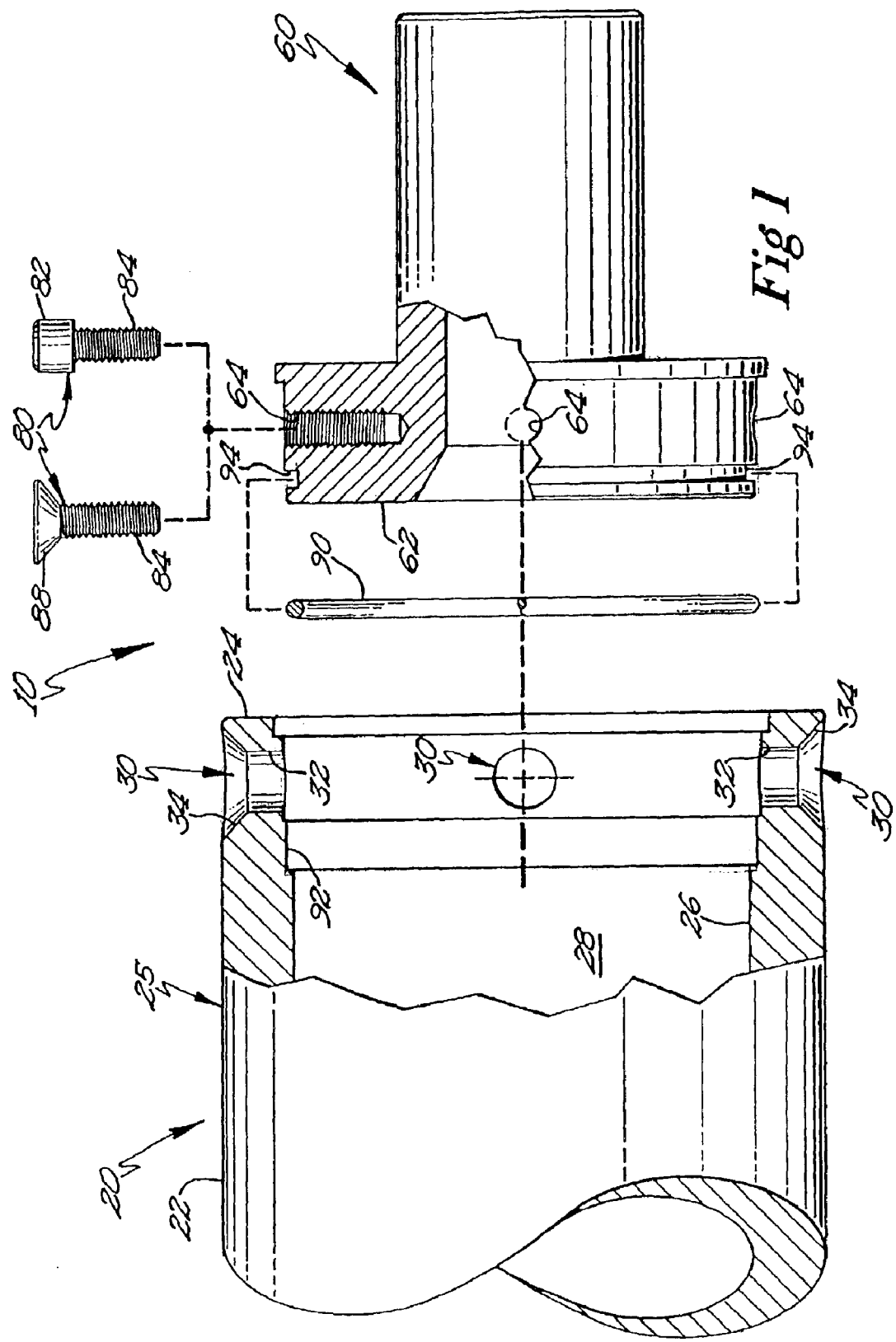
FIG. 1 is a side elevational view of an improved magnetron target attachment apparatus of the present invention with the target separated from the spindle.

1, having been joined with a unique attachment apparatus that includes an internally threaded spindle plug and socket-head fastener which cooperate to provide a flexible connection with a certain amount of play or movement.

FIG. 3 is an enlarged cross-sectional view of the unique attachment apparatus of FIG. 2, with the target tube and spindle separated from each other.

FIG. 4 is a cross-sectional view of the attachment apparatus of FIG. 2, but with a flat-head screw to provide a more fixed connection than the flexible connection FIG. 2.

DETAILED DESCRIPTION OF A PREFERRED EMBODIMENT

A preferred embodiment of the present invention is illustrated by way of example in FIGS. 1–4. With specific reference to FIG. 1, an improved cylindrical magnetron target and spindle attachment apparatus 10 includes a cylindrical target structure and a support spindle structure. The cylindrical target structure such as target 20 and the support spindle structure such as a spindle 60 are shown separated from each other but aligned for assembly into a single unit. The spindle 60, which is generally radially symmetrical about its axis, includes an extending portion of the support spindle structure such as a spindle plug 62 at the first end of the spindle 60. The spindle plug 62 has a thread aperture 64 defined at the circumference of the spindle plug 62 for receiving a thread 84 of a fastener such as a screw 80. A target 20 defines a receiver 25 in a hollow portion 28 of the target 20 interior 26. The spindle plug 62 is disposed within the receiver 25. An O-ring seal 90 is disposed between the 92 O-ring surface 92 of target tube 22 and the O-ring groove 94 of the spindle plug 62.

In FIGS. 1–4, the target 20 comprises a target tube 22. At an end 24 of the target tube 22 are head apertures 30. A head aperture 30 includes a socket portion 32 for receiving a socket 86 type of head 82. The head aperture 30 also includes a flat portion 34 for receiving a flat 88 type of head 82. The head aperture 30 is a countersunk hole for providing tight or flexible connections between the target 20 and the spindle 60. The target tubes 22 can be heavy and long, sometimes over 1,000 pounds and up to thirteen feet in length. The use of a socket 86 type of head 82 in the head aperture 30 of the target 20 provides a somewhat more flexible connection in the sense of providing some play than a flat 88 type of head 82. Instead of or subsequent to using the socket 86 type of head 82, the flat 88 type of head 82 may be utilized to provide a tighter connection.

FIG. 2 illustrates the improved magnetron target and spindle attachment apparatus 10 of FIG. 1 having been joined and includes an internally threaded spindle plug 62 and the socket 86 type head 82 of screw 80 which cooperate to provide a flexible connection with a certain amount of play or movement as indicated by the +, 0, and − symbols. Preferably, the size of the head aperture 30 is a little oversized relative to the size of the socket 86 type of head 82 of the screw 80. In a preferred embodiment, the oversize ranges between 0 and 0.06 inch. A more preferred embodiment has oversize ranges between 0.015 and 0.03 inch.

In FIG. 3 the attachment apparatus 10 of FIG. 2 is shown with the target tube 22 and spindle 60 separated from each other.

FIG. 4 shows the attachment apparatus 10 of FIG. 2 but with a flat 88 type head 82 of screw 80 to provide a more secure connection than that of the flexible connection illustrated FIG. 2.

A preferred method for assembling the target tube 22 to the spindle 60 is as follows. Apply a thin skin of vacuum grease to a clean O-ring seal 90 and place it into the clean O-ring groove 94 in the spindle plug 62. Next, apply a thin skin of vacuum grease to the clean O-ring surface 92 of the target tube 22. Insert and press the spindle 60 and spindle plug 62 into the receiver 25 of the target tube 22 where the apertures are aligned with each other. The spindle 60 can be turned in relation to the target tube 22 if the apertures are not quite aligned upon full insertion. Finally, install and tighten fasteners, such as screws 80, through the target tube 22 into the spindle plug 62. Repeat this process for the other end of the target tube 22.

Fasteners may be used with a nylon patch thread locking to prevent their backing out. Socket head fasteners may be used where slight flexibility in the coupling is preferred. Flat head fasteners may instead be utilized when a solid mechanical coupling is preferred.

While the present invention has been disclosed in connection with the preferred embodiment thereof, it should be understood that there may be other embodiments which fall within the spirit and scope of the invention as defined by the following claims.

What is claimed is:

1. An apparatus for affixing a cylindrical magnetron target to a rotatable support spindle, comprising:
   a cylindrical target structure having a receiver in a hollow portion of a target structure interior; and
   a support spindle structure having a spindle plug at one end thereof, the spindle plug being operatively configured to be entirely disposed within the receiver.

2. The apparatus of claim 1, wherein:
   the receiver comprises a head aperture for receiving a head of a fastener; and
   the spindle plug comprises a thread aperture for receiving a thread of a fastener.

3. The apparatus of claim 2, wherein the head aperture comprises a socket portion for receiving a socket head of a fastener.

4. The apparatus of claim 2, wherein the head aperture comprises a flat portion for receiving a flat head of a fastener.

5. The apparatus of claim 2, wherein the spindle plug comprises an O-ring groove operatively configured to hold an O-ring seal disposed between an inner surface of the target structure interior and the spindle plug.

6. The apparatus of claim 1, wherein the cylindrical target structure comprises a target.

7. A sputtering magnetron attachment apparatus comprising:
   a cylindrical target structure having a receiver in a hollow portion of a target structure interior, the receiver comprising a head aperture for receiving a head of a fastener; and
   a support spindle structure having a spindle plug at one end thereof disposed within the receiver, the spindle plug comprising a thread aperture for receiving a thread of a fastener; and
   a fastener disposed within the head aperture and the thread aperture such that the support spindle structure is operatively coupled to the cylindrical target structure.

8. The apparatus of claim 7, wherein the fastener comprises a socket head fastener and the head aperture comprises a socket portion for receiving a socket head of the fastener whereby the support spindle structure is flexibly coupled to the cylindrical target structure.

9. The apparatus of claim 7, wherein the fastener comprises a flat head fastener and the head aperture comprises a flat portion for receiving a flat head of the fastener whereby the support spindle structure is securely coupled to the cylindrical target structure.

10. The apparatus of claim 7, wherein the spindle plug comprises an O-ring groove operatively configured to hold an O-ring seal disposed between an inner surface of the target structure interior and the spindle plug.

11. The apparatus of claim 7, wherein the cylindrical target structure comprises a target.

12. A method for affixing a cylindrical magnetron target to a rotatable support spindle, the method comprising:

provide a cylindrical target structure having a receiver in a hollow portion of a target structure interior; and providing a support spindle structure having a spindle plug at one end thereof; and inserting the spindle plug entirely within the receiver such that the support spindle structure can be connected to the cylindulcal target structure.

13. The method of claim 12, wherein the provided receiver comprises a head aperture for receiving a head of a fastener and the provided spindle plug comprises a thread aperture for receiving a thread of a fastener, the method further comprising steps of:

providing a fastener;

turning the spindle structure relative to the target structure to align the head aperture with the thread aperture; and installing the fastener through the head aperture into the thread aperture to couple the spindle structure to the target structure.

14. The method of claim 13, wherein the providing a fastener step comprises providing a socket head fastener whereby the spindle structure is flexibly coupled to the target structure.

15. The method of claim 13, wherein the providing a fastener step comprises providing a flat head fastener whereby the spindle structure is securely coupled to the target structure.

16. The method of claim 12, wherein the provided spindle plug comprises an O-ring groove, the method further comprising steps of:

providing an O-ring seal; and placing the O-ring seal into the O-ring groove such that the O-ring seal is disposed between an inner surface of the target structure interior and the spindle plug.

* * * * *